United States Patent [19]

Street

[11] Patent Number: 5,789,737

[45] Date of Patent: Aug. 4, 1998

[54] HIGH DYNAMIC RANGE SEGMENTED PIXEL SENSOR ARRAY

[75] Inventor: Robert A. Street, Palo Alto, Calif.

[73] Assignee: Xerox Corporation, Stamford, Conn.

[21] Appl. No.: 787,461

[22] Filed: Jan. 22, 1997

[51] Int. Cl.⁶ .................................................. H01L 31/00
[52] U.S. Cl. ........................ 250/208.1; 257/291; 257/440
[58] Field of Search ............................ 250/208.1, 214.1; 257/290, 291, 292, 440, 443, 444

[56] References Cited

U.S. PATENT DOCUMENTS

| | | | |
|---|---|---|---|
| 4,547,074 | 10/1985 | Hinoda et al. | 257/440 |
| 5,017,989 | 5/1991 | Street et al. | |
| 5,164,809 | 11/1992 | Street et al. | |
| 5,262,649 | 11/1993 | Antonuk et al. | |
| 5,369,281 | 11/1994 | Spinnler et al. | 250/208.1 |
| 5,475,212 | 12/1995 | Nelson et al. | |

OTHER PUBLICATIONS

Street, et al., "Amorphous Silicon Arrays Develop a Medical Image", *IEEE, Circuits and Devices*, Jul. 1993, pp. 38–42.

*Primary Examiner*—Edward P. Westin
*Assistant Examiner*—Kevin Pyo
*Attorney, Agent, or Firm*—Fay, Sharpe, Beall, Fagan, Minnich & McKee

[57] ABSTRACT

A photodiode sensor for use as a pixel element of a sensor array includes the sensor area segmented into a plurality of discrete portions. Each discrete portion has a distinctive responsiveness to incident illumination, either with regard to capacitance or sensitivity. The portions are in common communication with a data line for generating a sum charged output representative of the illumination on the cumulative sensor portions. Since the dynamic range of the cumulative discrete portions is greater than any single one sensor portion, a wider dynamic range for sensor operability is achieved.

10 Claims, 2 Drawing Sheets

HIGH DYNAMIC RANGE SEGMENTED PIXEL SENSOR ARRAY

BACKGROUND OF THE INVENTION

1. Field of the Invention

The subject invention pertains generally to the field of imaging devices, and in particular to those devices containing an amorphous silicon sensor array.

2. Background Art

Amorphous silicon two-dimensional sensor arrays are well-known devices for real time imaging of incident energy (see R. A. Street et al., "Amorphous Silicon Arrays Develop a Medical Image", *IEEE Circuits and Devices*, July 1993, pp. 38–42, for a general description of the structure of the arrays). Such sensor arrays are particularly advantageous for radiation imaging because they present a relatively large size image sensor array. The sensor arrays operate on the principle of integrating a charge representative of the quantity of visible light incident on the sensor. A phosphor converter generates the visible light from incident high energy radiation. Such phosphor converters operate by absorbing X-ray photons to produce high energy electrons which, in turn, generate electron hole pairs, which in turn form visible light when the electrons and holes recombine. Thus, the amount of visible light generated in the phosphor converter is directly related to the radiation incident on the phosphor.

Each sensor in the array performs two main functions. First, the sensor captures light, and second, it stores the electrical charge that is generated by this light. When incident light is captured by the sensor, it is turned into electrons and the electrons are stored as electrical charge by the capacitance of the sensor. The maximum amount of charge that can be stored in a sensor is referred to as the saturation charge ("Qs"). A saturation charge for any sensor can be calculated by multiplying the capacitance of the sensor by the bias voltage initially applied across the sensor. (Note that in practice there is a small correction to the bias voltage due to the switching transient of the read out transistor.) When storage reaches the saturation charge level, then no more charge can be stored and the sensor is no longer capable of generating a signal representative of the incident light. Accordingly, operating a sensor array so that the sensors saturate will fail to generate a representative image. A typical saturation charge for such an amorphous silicon sensor element is on the order of 5 picocoulombs (corresponding to a capacitance of 1 pF and a bias of 5 V).

The dynamic range of the sensor is the useful operating range of the sensor and comprises the amount of charge that can be stored between the maximum level, the saturation of the sensor, and the minimal level which would comprise "noise" on the sensor output. The maximum level can be increased by increasing the capacitance, but as the capacitance is increased, the sensitivity of the sensor is decreased thereby limiting dynamic range expansion.

Conventional experience has been to employ image sensors that have operated in a linear dynamic range for ease in processing signals representative of incident energy. However, a linear response property tends to substantially narrow the dynamic range so that most sensors have a much poorer dynamic range than the human eye. The eye has an enormous dynamic range and its response to light is non-linear, varying roughly as the cube root of incident intensity. This non-linearity property is an important reason for its wide dynamic range.

The desirability and advantage of a wide dynamic range in an image sensor array is so that the array can generate a good image irrespective of the light level, which has importance in many technical applications. For example, with regard to medical imaging, the X-ray image of a person depends upon how large the person is or what part of the body is being imaged. One can appreciate that there is a big difference in the amount of X-rays that can pass through the patient in these instances. The advantage of a wide dynamic range sensor array for medical imaging is that use of such a device means that there are, accordingly, less worries about not generating light in the right range of the detector and X-ray exposure can be minimized.

The present invention describes a new and improved elemental sensor construction which overcomes the problem of the limited dynamic range of prior known sensor elements to provide a new sensor assembly which is simple in design, economical to manufacture, readily adaptable to a plurality of uses for providing electrical image information representative of input patterns and which provides a wide dynamic range, non-linear response to incident energy in a standard array configuration of a matrix addressed amorphous silicon array without requiring high performance readout electronics.

BRIEF SUMMARY OF THE INVENTION

In accordance with the present invention, there is provided an amorphous silicon image sensor array comprised of a plurality of high dynamic range sensors disposed as a matrix of addressable pixel elements, wherein each of the elements is associated with a gate line, a data line and a switch for discharging a stored charge in the sensor. A bias voltage line biases the intrinsic capacitance of the sensor. Each of the pixel elements comprises an amorphous silicon sensor segregated into a plurality of discrete sensor portions. Each portion has a distinctive responsiveness to incident illumination so that the combined effect of the aggregate portions is to provide a wide range of useful operation. The portions are in common communication with the data line for generating a summed charged output representative of the incident illumination. Readout electronics selectively address the data line and generate an electrical signal representative of the summed charged output and thus the illumination.

In accordance with another aspect of the present invention, the distinctive responsiveness of each sensor portion comprises different sensitivities and charge capacitances. The different sensitivities are caused by employing discrete sensor portions of different size. The sensitivity is proportional to the area of the sensor that is exposed to the incident illumination. Each of the sensor portions has a different charge saturation which is proportional to the total capacitance of the sensor. Supplemental capacitances to the inherent capacitance of a sensor portion are formed by including a capacitor formed between the sensor and a ground connection provided for that purpose.

One benefit obtained by use of the present invention is a high dynamic range segmented pixel imager.

Another benefit obtained from the present invention is a segmented pixel imager, wherein each of the segments has a different sensitivity and saturation charge. An added capacitor supplements the inherent capacitance of the sensor segments.

Yet another benefit of the subject invention is that the outputs of the segmented parts are collectively summed to form the output of the pixel element. The output is non-linear and achieves a higher dynamic range than conventional sensor elements without requiring high performance readout electronics.

DETAILED DESCRIPTION OF THE INVENTION

Figure 1:
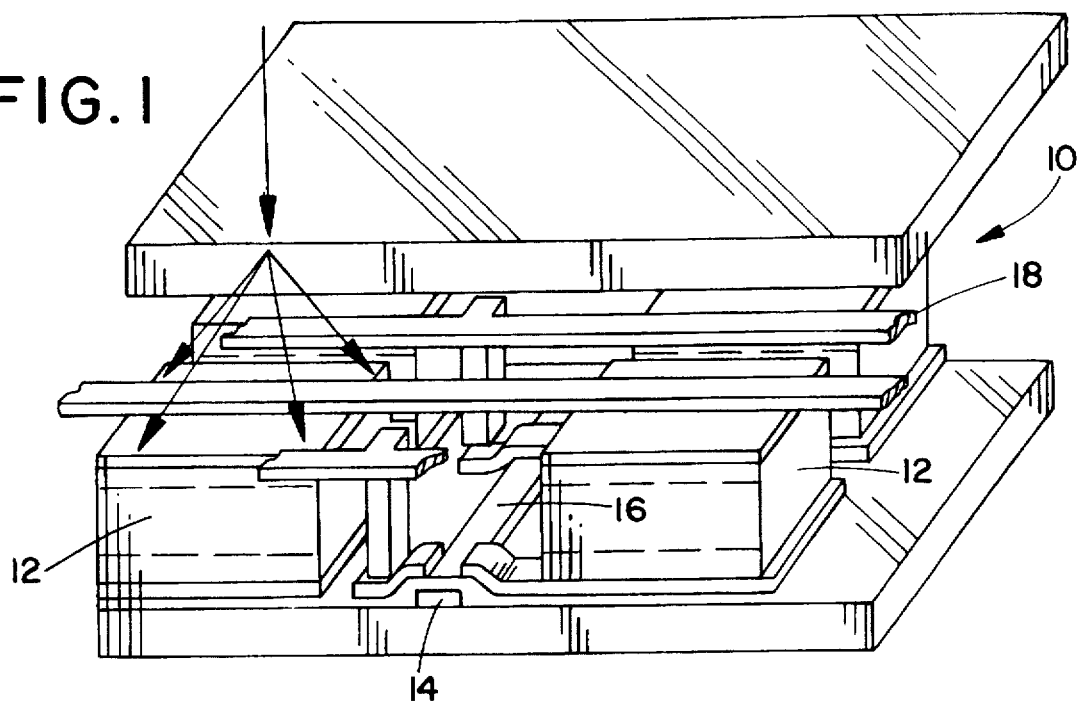
FIG. 1 is a perspective view in partial section of a typical structure of an amorphous silicon sensor array.

Referring now to the drawings wherein the showings are for purposes of illustrating the preferred embodiments of the invention only and not for purposes of limiting same, the FIGURES show an hydrogenated amorphous silicon image sensor array 10 comprised of a plurality of individual pixel elements. Although a-Si is preferably employed, other materials could also be used such as selenium and its alloys, or organic photoconductors. Each element is matrix addressable by a thin film transistor (TFT) 14, a gate line 16 and a data line 18. The circuit metallization structure for signal communication of accumulated charge of each pixel element is conventional and FIG. 1 is one typical schematic embodiment of element configuration including the metallization lines in the sensor array. Each sensor element 12 in the array is conventionally an amorphous silicon photodiode comprising an undoped layer sandwiched between doped contact layers. However other photodiode structures and different materials can be used.

Figure 2:
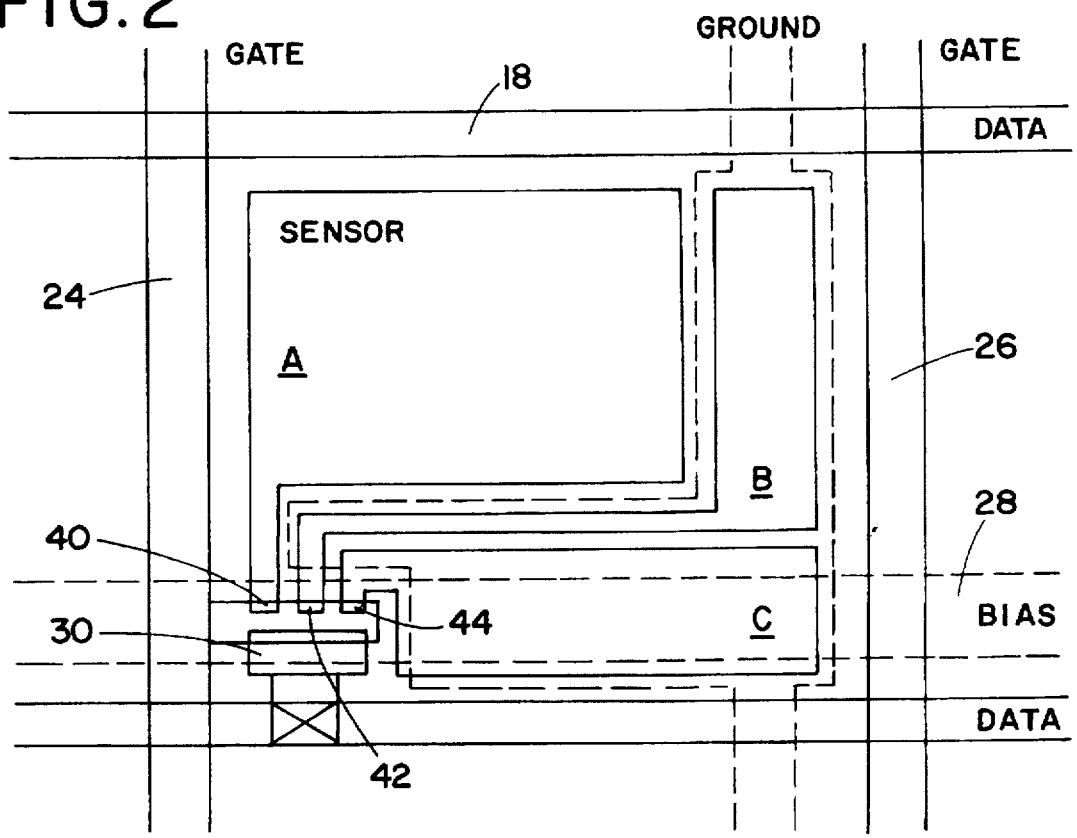
FIG. 2 is a schematic top plan view showing an individual sensor element segmented into different parts and further illustrating assorted metallization lines for signal communication therefrom.

With reference to FIG. 2, it is a feature of the invention that the charge accumulation layer of each sensor element 12 is segmented into discrete areas of different sizes, each having different sensitivities and responses to incident illumination, different capacitances and therefore different charge saturations. The drawing shows three sensor portions, but a different number can be used. Region A comprises about fifty percent (50%) of the available sensor area of an equivalent unsegmented pixel. The sensor in region A has no additional capacitance and its whole surface is exposed to illumination. Its capacitance is given by the inherent capacitance of the photodiode. Region B takes up about twenty-five percent (25%) of the sensor area and has a metal layer 26 placed beneath and connected to ground, which approximately doubles the capacitance of sensor portion B. Region C has about ten percent (10%) of the active sensor area exposed to illumination, but also uses the available space under the bias metal line 28 (which more than doubles the capacitance), as well as having its metal layer 26 placed beneath and connected to ground. With this configuration, the capacitances of the three regions are about equal, and yet only about fifteen percent (15%) of the active area is unused, primarily taken up in the gaps between the segmented sensors, regions A, B and C. Each of the segments thus are organized so that ground is connected to regions B and C and to adjacent pixels, but is not connected to region A. If it is required to place a gate metal layer beneath region A, for example, to provide a light shield, then it is not connected to ground and no additional capacitance results.

To keep the sensors A, B, C separate and non-interacting, they are patterned by photolithography, so that there is no sensor material in the gaps between the photodiodes. A passivation layer, normally silicon oxy-nitride, is deposited on top to ensure electrical isolation between the photodiodes, and this prevents any interaction. Similarly, the three contacts on the TFT 14 are isolated when the TFT is off. They are all connected to the common data line 18 when the TFT is on, as desired. Upon saturation of the photodiode, all additional charge is lost to recombination in the photodiode.

The summation of the discharge signal for accumulated charge in each of the sensor regions is accomplished by segmenting the source contact of the TFT 14 in the manner as shown in FIG. 2 with region terminal ends 40, 42, 44, with gaps of 2–5 microns. The different source voltages will not leak between the contacts when the TFT is off, and will sum together at the output when it is turned on.

The dotted line 26 in FIG. 2 outlines the ground connection. This is a metal layer placed below the sensors B and C and separated from the sensor by an insulating layer, usually the same layer that forms the gate dielectric of the TFT 14. The ground connection uses the same metal as the gate line 16, but is not connected to the gate line. The ground plane provides the extra capacitance described above. The ground plane is connected as a continuous metal layer from pixel to pixel and, on the periphery of the array, it should be connected to a suitably chosen external ground connection. Although referred to as ground, any dc voltage can be used.

Figure 3:
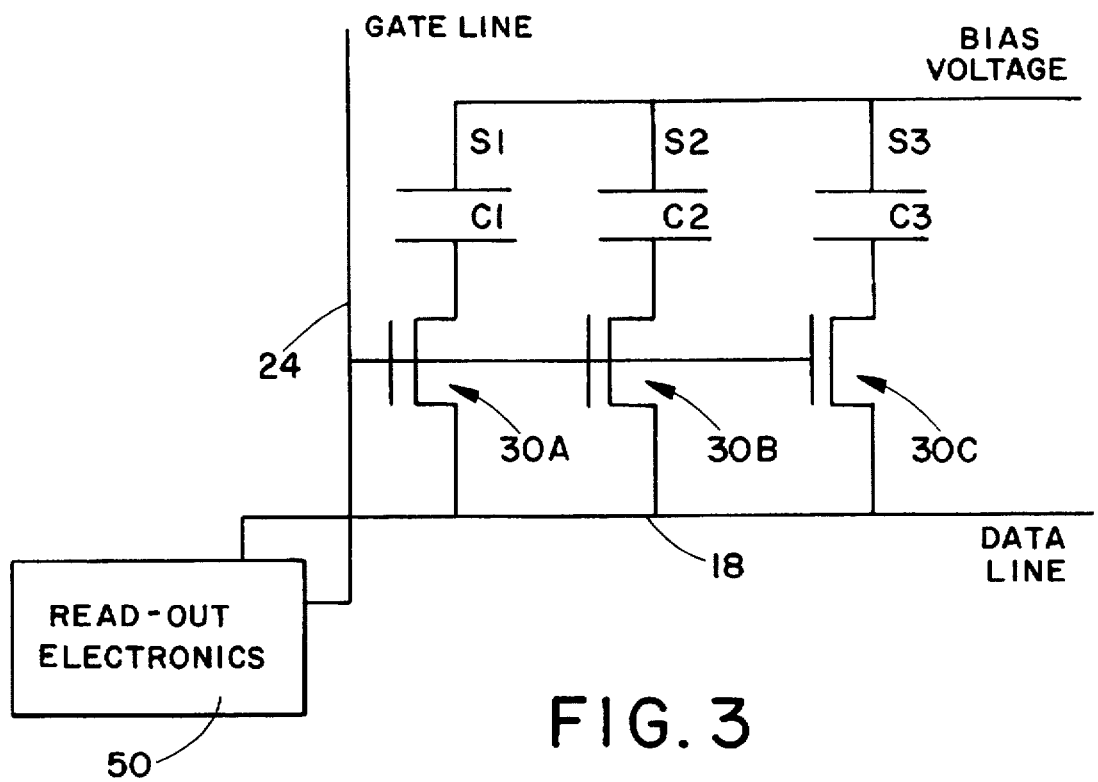
FIG. 3 is a schematic circuit diagram of an individual sensor element formed in accordance with the present invention; and, FIG. 4 is a graphical representation of output charge signal versus illumination intensity for a sensor element particularly showing the extended dynamic range of the invention and the non-linear response to incident light.

With reference to FIG. 3, a schematic circuit representative of the physical embodiment shown in FIG. 2 is illustrated. The sensor areas of varying sensitivity S1, S2, S3 respectively correspond to regions A, B and C of FIG. 2. It can be appreciated that when the gate line 24 closes switches 30A, 30B, 30C the accumulated charge on capacitors C1, C2 and C3 will be summed as a voltage on the data line 18.

The three sensors (A, B, C) have capacitances $C_1$, $C_2$, $C_3$, and sensitivities to $\sigma_1$, $\sigma_2$ and $\sigma_3$ (where $\sigma_1 > \sigma_2 > \sigma_3$). In general, sensor sensitivity is proportional to the active area of the sensor and so $\sigma_i$ can be thought of as the fill factor of sensor i. The fill factor is the fraction of the pixel area occupied by the exposed sensor area. The charge generated under illumination L is, $Q_i = L\sigma_i$, with saturation occurring at $Q_{i,sat} = C_i V_B$, where $V_B$ represents the bias voltage.

Figure 4:
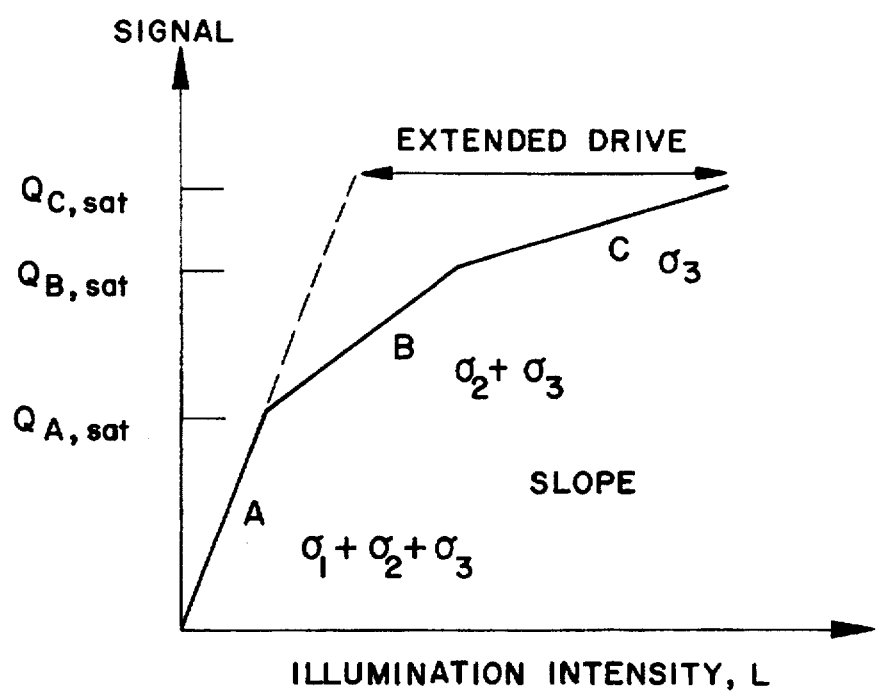

For simplicity of analysis we assume abrupt saturation. In reality, the transition between regions will be smoother than illustrated in FIG. 4. In region A of FIG. 4, the total signal is $Q_A = L(\sigma_1 + \sigma_2 + \sigma_3)$, and saturates a light intensity of $L_{A,sat} = C_1 V_B/\sigma_1$ with, $Q_{A,sat} = C_1 V_B(1+(\sigma_2+\sigma_3)/\sigma_1)$.

In region B the signal is $Q_B = Q_{A,sat} + L(\sigma_2+\sigma_3)$, and saturates at $L_{B,sat} = C_2 V_B/\sigma_2$ with, $Q_{B,sat} = C_1 V_B + C_2 V_B(1+\sigma_3/\sigma_2)$.

Finally, in region C, the total signal is $Q_c = Q_{A,sat} + Q_{B,sat} + L\sigma_3$, and saturates at $L_{C,sat} = C_3 V_B/\sigma_3$ with, $Q_{C,sat} = C_1 V_B + C_2 V_B + C_2 V_B$.

Assuming that $\sigma_1:\sigma_2:\sigma_3$ are in the ratio 1:0.3:0.1, then the sensitivity in the three regions is in the ratio 1.4:0.4:0.1, and the dynamic range is increased by about ten times. With these values, the saturation charge is in the ratio $1.4C_1$; $C_1+1.33C_2$; $C_1+C_2+C_3$. Equal values of the capacitance give saturation charges in the ratio 1.4:2.33:3, which puts more of the dynamic range in the high sensitivity region. Capacitances in the ratio 1:1.5:2 result in the dynamic range being approximately the same in the three regions.

The sensor response primarily depends on $\sigma_1$, and $C_1$, but these two are constrained by the design of the pixel. Normally $C_1$ is proportional to $\sigma_1$, because the sensor is in the capacitor, so it is not immediately obvious how to make $\sigma$ small but C large and retain the high total fill factor needed for an efficient sensor. The subject invention teaches to adjust the values of the capacitances and make an efficient design of the pixel by making use of two features in a standard array architecture:

a) that the bias line crosses over the sensor and necessarily blocks light; and b) that a gate metal pad can be placed under the sensor (it is sometimes used to provide extra light shielding) and can be used to add capacitance by connecting the pad to ground (or bias).

The specific segmentation scheme discussed above is only one possible embodiment. There are very many other configuration variations possible to similarly achieve a high dynamic range sensor design. The number of segments can also be varied to include more or less than the three shown. The sensor areas themselves can be configured in various different sizes and geometries to optimize any particular desired response. The capacitances can be further controlled by variably selecting the thickness of the sensor region and possibly also the underlying dielectric separating the gate metal light shield (although this may effect the TFT response also). Segmentation into a different number of regions may also be desirable, although three (3) seem to be a good engineering compromise between high dynamic range and fill factor. Fewer segment regions give a smaller dynamic range increase and more segment regions cause a greater loss in the overall fill factor.

Readout electronics 50 (FIG. 3) are conventional with existing sensor array systems. Provided that the films comprising the sensor array are reasonably uniform in thickness, the array response can be calibrated and a single look-up table used to linearize the response.

The invention has been described with reference to preferred embodiments. Obviously, modifications and alteration occur to others upon the reading and understanding of this specification. It is my intention to include all such modifications and alterations insofar as they come within the scope of the appended claims or the equivalents thereof.

Having thus described my invention, I now claim:

1. An image sensor array comprised of a plurality of high dynamic range sensors disposed as matrix addressable pixel elements each associated with a gate line, a data line and a bias voltage line, wherein each of the pixel elements comprises an amorphous silicon sensor segregated into a plurality of discrete sensor portions, each portion having a distinctive responsiveness to incident illumination, wherein the portions are in common communication with the data line for generating a summed charge output representative of the illumination; and, read-out electronics for selectively addressing the data line and generating an electrical signal representative of the illumination.

2. The sensor array as defined in claim 1 wherein the distinctive responsiveness of each sensor portion comprises different sensitivities.

3. The sensor array as defined in claim 2 wherein the discrete sensor portions have differently sized active areas causing the different sensitivities.

4. The sensor array as defined in claim 3 wherein the sensor portions have different charge saturations.

5. The sensor array as defined in claim 1 wherein each sensor portion bus has approximately a same capacitance.

6. The sensor array as defined in claim 5 wherein the capacitance results from a capacitor formed by a gate metal pad connected to a common voltage or ground.

7. The sensor array as defined in claim 1 wherein the sensor comprises an amorphous silicon photodiode.

8. The sensor array as defined in claim 1 wherein the sensor portions have terminal ends in parallel connection to a switch pad of a switch wherein the switch includes means for simultaneous discharge of the sensor portions for the summed charge output by control of the read-out electronics.

9. A pixel element for use in a sensor array comprising an hydrogenated amorphous silicon sensor for integrating an accumulated charge representative of energy incident to the sensor, including:

a plurality of discrete sensor regions comprising the sensor wherein the regions each individually consume a different percentage of available fill for a cumulative wide dynamic range, the sensor regions being in parallel connection to a single discharge switch for simultaneous discharge of integrated charge; and, a capacitor formed between a one of the sensor regions and a metallization line of the element for increasing a capacitance of the one region beyond an inherent region capacitance.

10. The pixel element as claimed in claim 9 wherein the sensor consists of three of said discrete sensor regions, said three comprising approximately 50%, 25% and 10% of the fill factor, respectively.

* * * * *